United States Patent
Kang

(10) Patent No.: US 7,119,001 B2
(45) Date of Patent: Oct. 10, 2006

(54) SEMICONDUCTOR CHIP PACKAGES AND METHODS FOR FABRICATING THE SAME

(75) Inventor: Byoung Young Kang, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/026,661

(22) Filed: Dec. 29, 2004

(65) Prior Publication Data

US 2006/0046348 A1    Mar. 2, 2006

(30) Foreign Application Priority Data

Sep. 1, 2004    (KR) .................... 10-2004-0069510

(51) Int. Cl.
*H01L 21/44*    (2006.01)
*H01L 21/4763*    (2006.01)

(52) U.S. Cl. ...................................... 438/598; 438/618

(58) Field of Classification Search ................ 438/106, 438/459, 597, 598, 618, 622, 674, 675
See application file for complete search history.

(56) References Cited

U.S. PATENT DOCUMENTS 5,851,845 A    12/1998    Wood et al.
6,221,769 B1    4/2001    Dhong et al.

FOREIGN PATENT DOCUMENTS

KR    2003-56174    7/2003

*Primary Examiner*—Scott B. Geyer
(74) *Attorney, Agent, or Firm*—Andrew D. Fortney

(57) ABSTRACT

Semiconductor chip packages of a wafer level and method for fabricating the same are disclosed, in which a wafer electrode pad is connected with an external circuit by a via-electrode penetrating a silicon wafer. An illustrated example package includes a wafer having a first surface and a second surface opposite the first surface; a semiconductor device having at least one of electrode pad on the first surface; a protective layer covering the first surface of the silicon wafer; a via-hole from the second surface to the electrode pad on the first surface, a via electrode within the via-hole; and a solder ball or a solder bump on the second surface for electrical connection between the via-electrode and an external circuit.

12 Claims, 5 Drawing Sheets

SEMICONDUCTOR CHIP PACKAGES AND METHODS FOR FABRICATING THE SAME

FIELD OF THE DISCLOSURE

The present disclosure relates generally to semiconductor fabrication and, more particularly, to semiconductor chip packages and methods for fabricating the same.

BACKGROUND

Generally, an integrated circuit (IC) of semiconductor devices (e.g., a diode and a transistor) is formed as a package, which is mounted on a printed circuit board (PCB). These packages have become smaller with the trend toward smaller-sized products. The Ball Grid Array package (hereinafter, referred to as 'BGA'), which emerged in the early 1990's, has been widely used for high performance electronic equipment of different functions.

FIG. 1 is a cross sectional view of an example prior art BGA package. As shown in FIG. 1, a chip pad 102 and a bonding pad 108 are formed on a substrate 100. A chip 106 is bonded on the chip pad 102 of the substrate 100 by an epoxy adhesive 104. To provide an electrical connection between the substrate 100 and the chip 106, a wire bonding 110 is connected between the bonding pad 108 of the substrate 100 and a chip pad (not shown) of the chip 106. An epoxy-molding compound 112 is included in the package so as to protect the wire bonding 110. The chip package is then mechanically and electrically fixed to a printed circuit board (PCB) of a completed product by solder balls 114 formed on a lower surface of the substrate 100.

The prior art BGA package is fixed to the PCB by sequentially polishing a rear surface of a wafer, sawing the wafer into chips, bonding the chips, wire bonding, and molding.

In this BGA chip package, the substrate is connected with the chip by the wire bonding. This places a limitation on the small-sized package. Also, the fabrication process is very complicated, and it is not environmentally sustainable because it employs harmful pollutants such as the epoxy-molding compound. Also, the package is fabricated after sawing the wafer into chips.

However, a wafer level package (WLP) has recently been developed in which the IC package is formed before sawing the wafer into chips. This simplified method makes mass production possible. Furthermore, the plurality of chips arranged in a matrix-type configuration on the wafer are simultaneously fabricated, and are tested, so that it is possible to decrease the fabrication time and cost in the packaging and testing process for the IC chip.

Wood, U.S. Pat. No. 5,851,845, describes a wafer level package fabrication method wherein a rear surface of a wafer including a plurality of dies is thinned by grinding or etching, and a semiconductor package is formed by bonding the thin wafer to a substrate and sawing the substrate. Also, Sang Hoo Dhong, U.S. Pat. No. 6,221,769, describes a package fabrication method including mechanically forming a via-hole through a silicon substrate, and connecting the silicon substrate with a chip pad by the via-hole.

Furthermore, Korean Patent Publication. No. 2003-56174 describes a wafer level chip scale package (CSP) having no wire bonding wherein a conductive layer is formed on one surface of a chip, and a substrate having a conductive via-hole is bonded between a PCB and the chip. In this WLP method, instead of a prior art bonding method (wire bonding, TAB, flip chip bonding, etc.) between a chip and a package, a chip pad is connected with an external terminal by using a wiring method of a pre-semiconductor process before dicing in the same principle as that of the flip chip. However, this wiring method is very complicated, and requires an additional substrate provided between the chip and the PCB. Therefore, it limits the thinness of the completed product, and decreases the reliability of the chip.

BRIEF DESCRIPTION OF THE DRAWINGS

Wherever possible, the same reference numbers will be used throughout the drawings to refer to the same or like parts.

DETAILED DESCRIPTION

Figure 1:
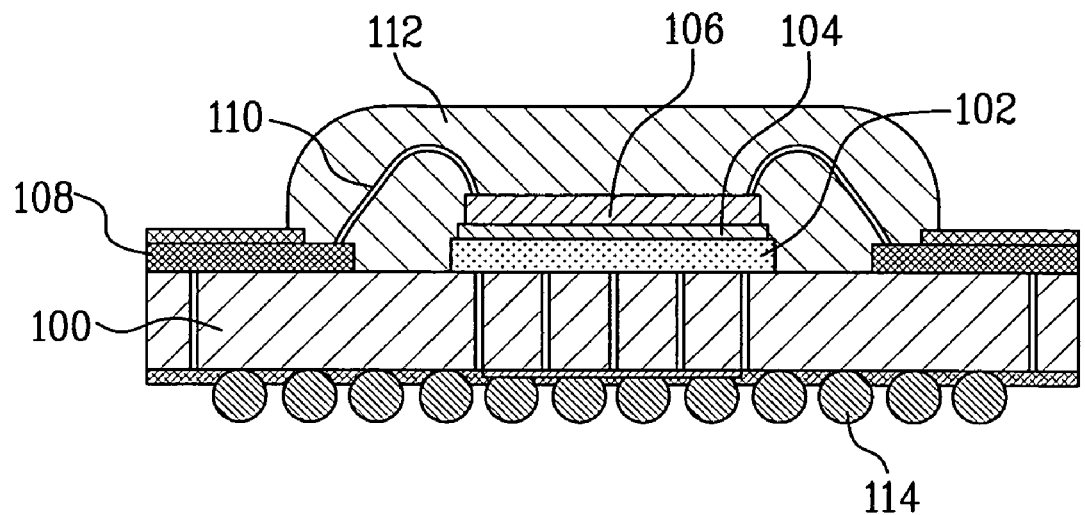
FIG. 1 is a cross sectional view of a prior art BGA package.
Figure 2A:
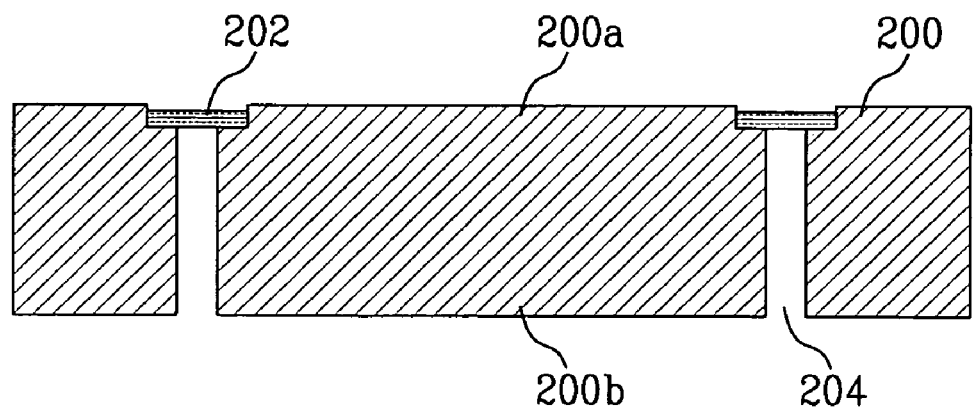
FIG. 2A to FIG. 2E are cross sectional views illustrating an example process for fabricating a semiconductor chip package performed in accordance with the teachings of the present invention.

FIG. 2A to FIG. 2E are cross sectional views illustrating an example process for fabricating a semiconductor chip package performed in accordance with the teachings of the present invention. First, as shown in FIG. 2A, a semiconductor device (not shown) including an electrode pad 202 for electrical connection with an external circuit is formed on a first surface 200a of a silicon wafer 200. A via-hole (or a through hole) 204 is formed from a second surface 200b of the silicon wafer 200 to the electrode pad 202 on the first surface 200a.

The via-hole 204 may be formed in a laser process or a dry etch process (e.g., a reactive ion etch (hereinafter, referred to as 'RIE')). Also, the via-hole 204 may be formed in various shapes (e.g., a circle, a triangle, a quadrangle, or a polygon). Furthermore, the via-hole 204 may have a constant cross-section, or a cross-section of the via-hole 204 may decrease or increase as one moves from the second surface 200b to the first surface 200a.

Figure 2B:
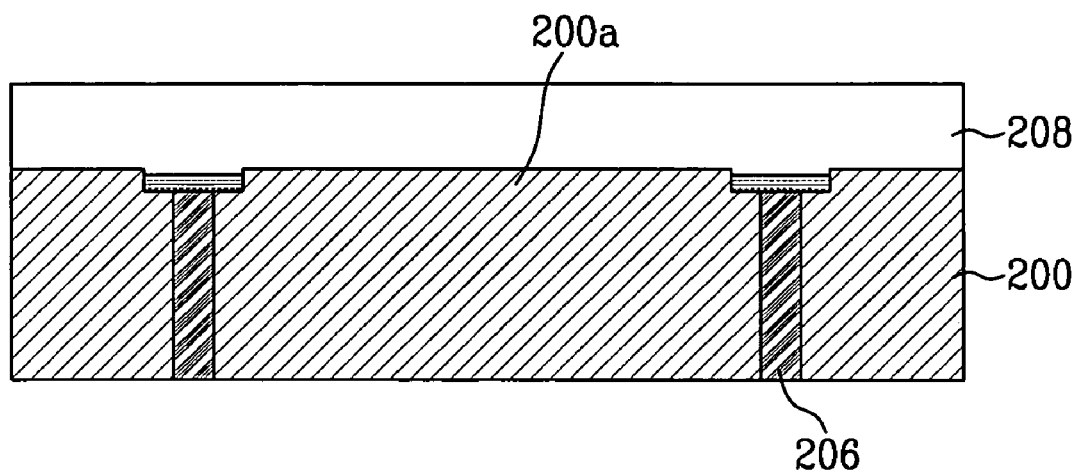

Then, as shown in FIG. 2B, the via-hole 204 is filled with a conductor, thereby creating a via-electrode 206. After forming the via-electrode 206, a protective layer 208 is formed to cover the first surface 200a.

The via-electrode 206 may be formed in an electric gliding. Also, the conductor may be any metal suitable for electric gliding, for example, gold (Au), silver (Ag), copper (Cu), aluminum (Al), nickel (Ni), or tungsten (W).

Also, the via-electrode 206 may be formed by vacuum evaporation, by sputtering, by chemical vapor deposition (hereinafter, referred to as 'CVD'), or by baking a conductive paste filling the hole 204. The via-electrode 206 may be formed of any conductive material, for example, gold (Au), silver (Ag), copper (Cu), aluminum (Al), nickel (Ni), chrome (Cr), tungsten (W), and/or a conductive metal alloy.

The protective layer 208 may be formed of an organic insulating layer or an inorganic insulating layer, so as to protect the semiconductor chip from external influences. For example, the protective layer 208 may be formed of a polyimide or a nitride.

Figure 2C:
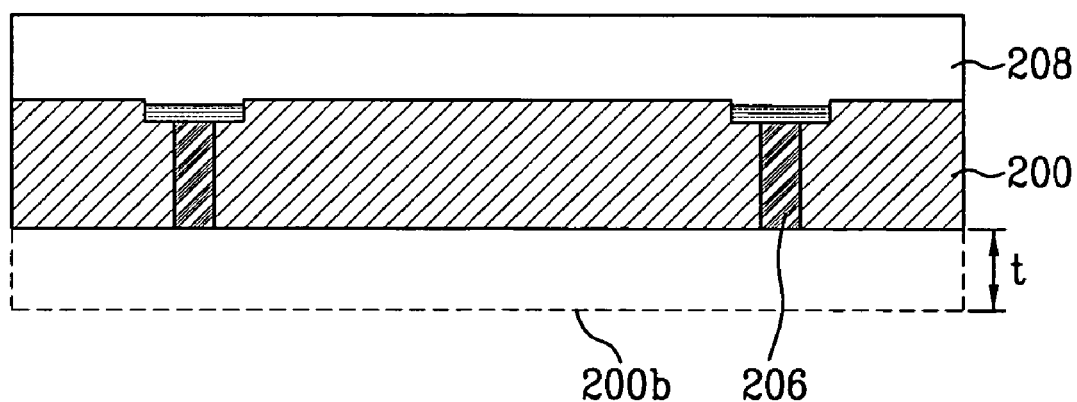

As shown in FIG. 2C, a predetermined thickness 't' of the second surface 200b of the silicon wafer 200 is removed by polishing. As a result, the silicon wafer 200 is reduced to a desired thickness. The thickness of chip is determined according to the thickness of the silicon wafer 200. Preferably, the polishing is performed with a chemical mechanical polishing process (hereinafter, referred to as 'CMP').

Figure 2D:
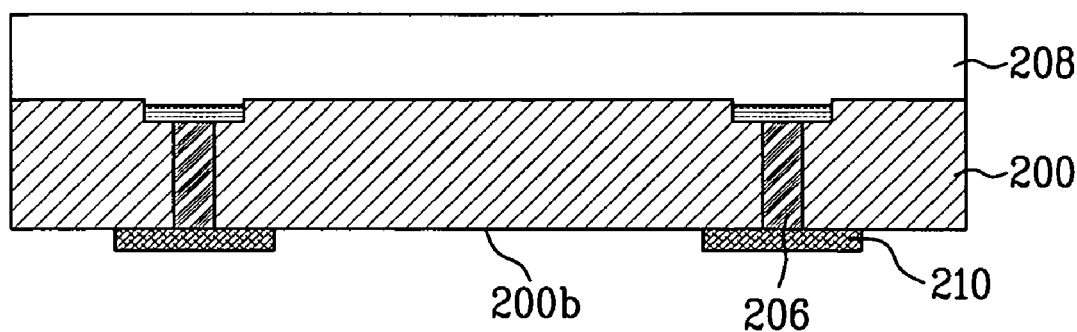

Next, as shown in FIG. 2D, a barrier metal layer 210 is formed on the portion of the via-electrode 206 which is exposed on the second surface 200b of the silicon wafer 200.

By forming the barrier metal layer 210, it is possible to enhance adhesion when forming a solder bump or a solder ball, and to prevent cracks generated by heat when using the chip, thereby improving the reliability of chip. The barrier metal layer 210 may be formed of titanium (Ti), titanium nitride (TiN), tantalum nitride (TaN), Ti/Tin or Ta/TaN. Preferably, the barrier metal layer 210 may be formed in a CVD process.

Figure 2E:
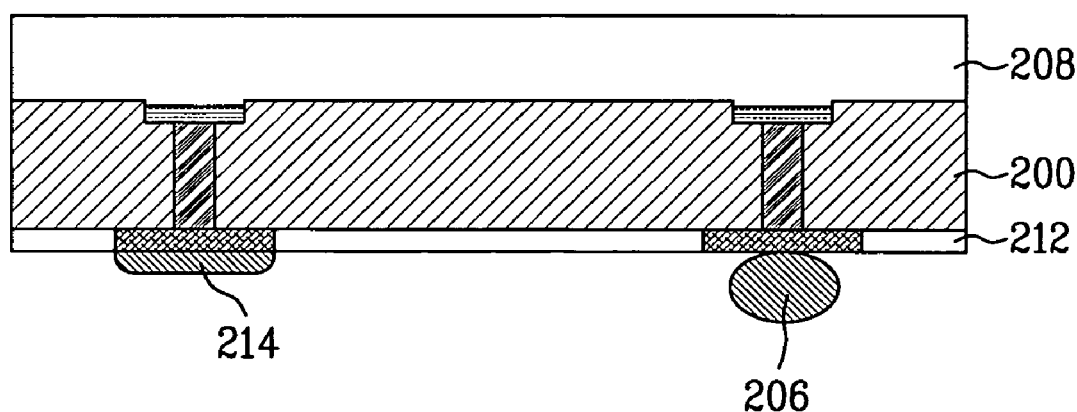

Subsequently, as shown in FIG. 2E, a solder bump 214 or solder ball 216 is formed on the barrier metal layer to provide the electrical connection between the external circuit and the chip. Preferably, the solder bump 214 or solder ball 216 may be formed of any conductive metal, for example, gold (Au), copper (Cu), or tin (Sn).

Before forming the solder bump 214 or solder ball 216, it is possible to form an additional solder mask 212. In such an approach, a solder resist is coated, and a thermal process is performed thereon, so that the portion corresponding to the solder bump 214 or the solder ball 216 is exposed, thereby forming the solder mask 212.

Although not shown, conventional processes are then performed to saw the silicon wafer 200 into individual chips, thereby completing the wafer level package.

Figure 3A:
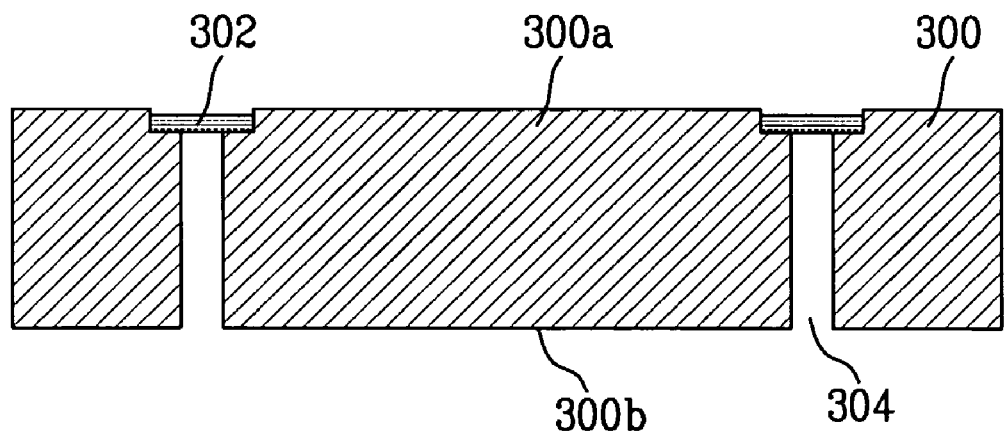
FIG. 3A to FIG. 3D are cross sectional views illustrating another example process for fabricating a semiconductor chip package performed in accordance with the teachings of the present invention.

FIG. 3A to FIG. 3D are cross sectional views of another example process for fabricating a semiconductor chip package performed in accordance with the teachings of the present invention. First, as shown in FIG. 3A, a semiconductor device (not shown) including an electrode pad 302 for an electrical connection with an external circuit is formed on a first surface 300a of a silicon wafer 300. Also, a via-hole 304 is formed from a second surface 300b of the silicon wafer 300 to the electrode pad 302 on the first surface 300a. The via-hole 304 is formed in the same process as was used in the first example process described in connection with FIGS. 2A–2E.

Figure 3B:
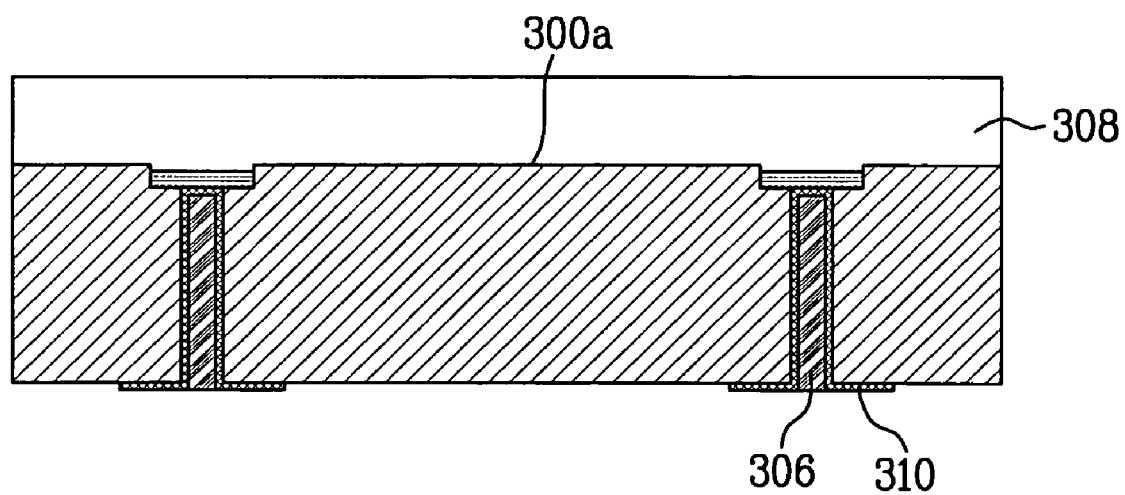

Next, as shown in FIG. 3B, a barrier metal layer 310 is deposited along the surface 300b of the via-hole 304. The via-hole 304, (which is lined with the barrier metal layer 310), is then filled with a conductor, thereby forming a via-electrode 306. Then, a protective layer 308 is formed to cover the first surface 300a of the silicon wafer 300.

The barrier metal layer 310, the via-electrode 306 and the protective layer 308 are formed of the same material and in the same method as explained above in connection with the first example process described in connection with FIGS. 2A–2E.

Figure 3C:
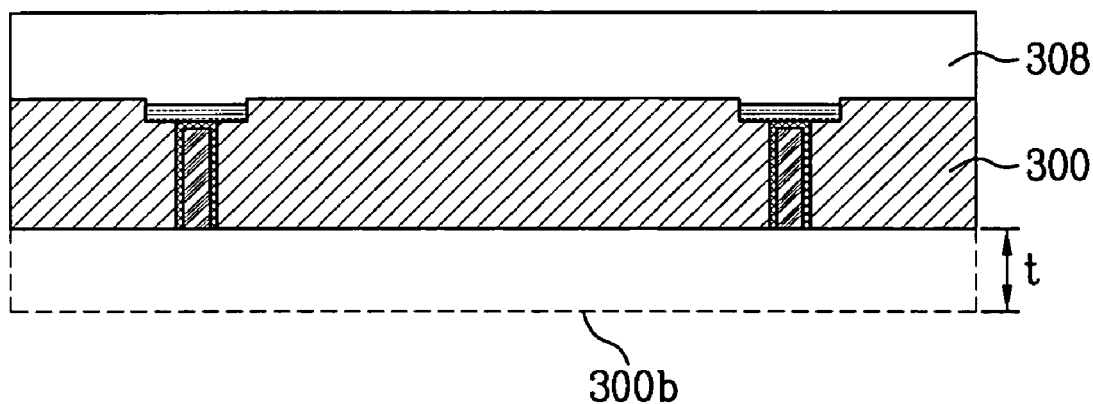

Subsequently, as shown in FIG. 3C, a predetermined thickness 't' of the second surface 300b of the silicon wafer 300 is removed by polishing. As a result, the silicon wafer 300 is reduced to a desired thickness. Preferably, the polishing process is a CMP process.

Figure 3D:
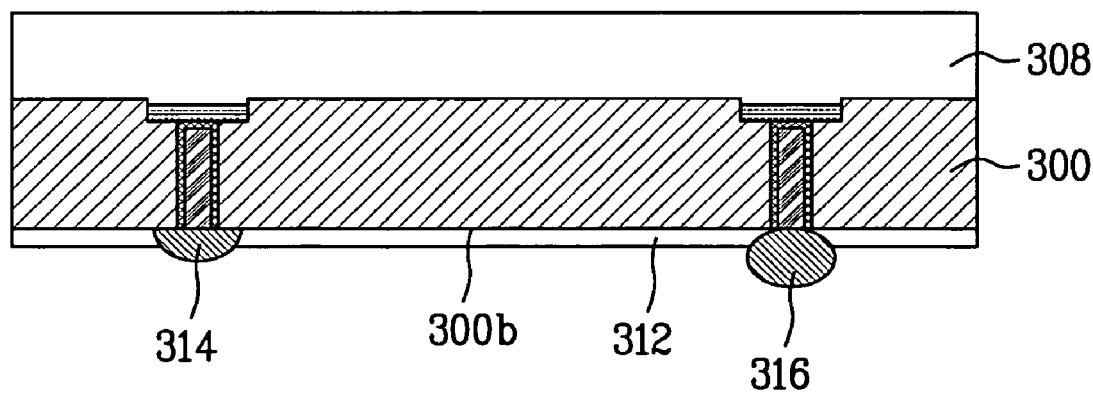

Next, as shown in FIG. 3D, a solder bump 314 or a solder ball 316 for the electrical connection between the external circuit and the chip is formed on the exposed via-electrode 306. The solder bump 314 or the solder ball 316 may be formed of any conductive metal material, for example, copper (Cu), gold (Au), or tin (Sn). Before forming the solder bump 314 or the solder ball 316, it is possible to form a solder mask 312 in the same manner as explained above in connection with the first example illustrated in FIGS. 2A–2E.

Although not shown, before forming the solder bump 314 or the solder ball 316, a barrier metal layer may be additionally provided between the solder bump 314/solder ball 316 and the via-electrode 316. The barrier metal layer may be formed of titanium (Ti), titanium nitride (TiN), tantalum nitride (TaN), Ti/Tin or Ta/TaN. Preferably, the barrier metal layer 210 is formed in a CVD process.

Although not shown, conventional processes are performed to saw the silicon wafer 300 into individual chips, thereby completing the wafer level package.

As described above, in an example semiconductor chip package, a via-electrode is formed from a second surface of the silicon wafer to an electrode pad on a first surface having a semiconductor device. As a result, a simplified fabrication process, improved device characteristics, and a small-sized and thin product are obtained. In addition, since the barrier metal layer is formed, it is possible to fabricate the semiconductor chip package having thermo-resistance characteristics and high reliability. Also, unlike the prior art discussed above, it is not necessary to use an epoxy-molding compound in the disclosed semiconductor chip packages, thereby avoiding the creation of harmful pollutants.

In view of the foregoing, persons of ordinary skill in the art will appreciate that the disclosed packages are very suitable for use as a chip scale package of a small-sized semiconductor device. Furthermore, the disclosed packages and methods can be applied to a multi chip module (MCM).

In a disclosed example semiconductor chip package, the electrode pad is connected with an external circuit by a via-electrode, thereby obtaining a simplified fabrication process, improved device characteristics, a thin and small-sized product, great heat-emission efficiency, an environmentally sustainable product, and a decrease in fabrication costs.

Persons of ordinary skill in the art will further appreciate that semiconductor chip packages of a wafer level and method for fabricating the same have been disclosed, wherein a via-electrode is formed from a second surface of a silicon wafer to an electrode pad on a first surface opposite the second surface, and the silicon wafer is connected with an external circuit by a solder bump or solder ball.

More specifically, a disclosed example semiconductor chip package includes a silicon wafer having a first surface and a second surface opposite the first surface; a semiconductor device having at least one electrode pad on the first surface; a protective layer covering the first surface of the silicon wafer; a via-hole from the second surface to the electrode pad on the first surface, a via electrode within the via-hole; and a solder ball or a solder bump on the second surface for electrical connection between the via-electrode and an external circuit.

A disclosed example method for fabricating a semiconductor chip package includes preparing a silicon wafer having a first surface and a second surface opposite the first surface; forming a semiconductor device having at least one electrode pad on the first surface of the silicon wafer; forming a via-hole from the second surface to the electrode pad on the first surface; forming a via-electrode within the via-hole; forming a protective layer covering the first surface; polishing the second surface to reduce a thickness of the silicon wafer; and forming a solder bump or a solder ball on the second surface for electrical connection between the via-electrode and an external circuit.

It is noted that this patent claims priority from Korean Patent Application Serial Number P2004-69510, which was filed on Sep. 1, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for fabricating a semiconductor chip package comprising:
   preparing a silicon wafer having a first surface and a second surface opposite the first surface;
   forming a semiconductor device having at least one electrode pad on the first surface of the silicon wafer;
   forming a via-hole from the second surface to the electrode pad on the first surface;
   forming a via-electrode within the via-hole;
   forming a protective layer covering the first surface;
   polishing the second surface to reduce a thickness of the silicon wafer; and
   forming a solder bump or a solder ball on the second surface for electrical connection between the via-electrode and an external circuit.

2. A method as defined in claim 1, further comprising forming a barrier metal layer on a surface of the via-hole before forming the via-electrode.

3. A method as defined in claim 2, wherein the barrier metal layer is formed of any one of titanium, titanium nitride, tantalum nitride, Ti/TiN, or Ta/TaN.

4. A method as defined in claim 1, further comprising forming a baffler metal layer on a surface of the via-electrode which is exposed toward the second surface before forming the solder bump or the solder ball.

5. A method as defined in claim 4, wherein the barrier metal layer is formed of any one of titanium, titanium nitride, tantalum nitride, Ti/TiN, or Ta/TaN.

6. A method as defined in claim 1, further comprising forming a solder mask before forming the solder bump or the solder ball.

7. A method as defined in claim 1, wherein the protective layer is formed of polyimide.

8. A method as defined in claim 1, wherein the via-hole is formed in a laser process or an RIC process.

9. A method as defined in claim 1, wherein the via-electrode is formed by an electric gliding process, a vacuum evaporation process, a CVD process, or a screen printing process.

10. A method as defined in claim 1, wherein the via-electrode is formed of any one of gold, silver, copper, aluminum, or nickel.

11. A method as defined in claim 1, wherein the second surface is polished in a CMP process.

12. A method as defined in claim 1, further comprising dividing the wafer into individual chips by sawing.

* * * * *